(12) United States Patent
Tolson

(10) Patent No.: US 6,212,367 B1
(45) Date of Patent: *Apr. 3, 2001

(54) MOBILE TELEPHONE APPARATUS WITH TUNABLE FILTER TUNED TO THE TRANSMIT BAND

(75) Inventor: Nigel J Tolson, Berkshire (GB)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/028,813

(22) Filed: Feb. 24, 1998

(51) Int. Cl.[7] ........................................ H04B 1/04
(52) U.S. Cl. ............................. 455/114; 455/73; 455/78; 455/115; 455/120; 455/126
(58) Field of Search ................................... 455/115, 114, 455/116, 120, 125, 126, 77, 78, 79, 82, 84, 87, 73

(56) References Cited

U.S. PATENT DOCUMENTS

| | | | |
|---|---|---|---|
| 4,422,047 | * 12/1983 | Wright | 455/73 |
| 4,618,997 | * 10/1986 | Imazeki et al. | 455/76 |
| 5,239,686 | * 8/1993 | Downey | 455/78 |
| 5,448,769 | * 9/1995 | Jantti | 455/115 |

FOREIGN PATENT DOCUMENTS

| | | | |
|---|---|---|---|
| 2092845 | 8/1982 | (GB) . | |
| 2276293 | * 9/1994 | (GB) | H04B/1/44 |

* cited by examiner

*Primary Examiner*—Lee Nguyen
(74) *Attorney, Agent, or Firm*—Sughrue, Mion, Zinn, Macpeak & Seas, PLLC

(57) ABSTRACT

A mobile phone apparatus which is capable of meeting the stringent specifications on transmitter noise in the receive band. The mobile phone apparatus has a modulator for producing a signal to be transmitted in a transmit band, a power amplifier for supplying the signal to be transmitted to an aerial, a tunable filter disposed between the modulator and the power amplifier and having a passband and an attenuation band, and a control circuit for tuning the filter such that the passband is at the transmit band and the attenuation band is at a receive band of the apparatus.

3 Claims, 2 Drawing Sheets

MOBILE TELEPHONE APPARATUS WITH TUNABLE FILTER TUNED TO THE TRANSMIT BAND

BACKGROUND OF THE INVENTION

1. Field of the Invention

The present invention relates to a mobile phone apparatus.

2. Description of the Prior Art

A known type of mobile phone transmits and receives on separate frequencies in the UHF (Ultra High Frequency) band. Such phones are used in the TDMA [Time Division Multiple Access] (GSM [Global System for Mobile communication]) systems, for which there are stringent specifications on the amount of transmitter noise which falls within the receiver band. A known technique for meeting this specification uses a high Q (quality factor) notch filter at the output of the power amplifier of the phone transmitter. However, such a filter is relatively large and has a significant insertion loss. In order to compensate for this loss, the power amplifier has to provide a higher output power and therefore draws a higher current from the power supply, which is normally a battery within the phone. Thus, for a given size of battery, the talk time of the phone is reduced.

In another known type of phone, a phase locked loop is connected between a modulator which produces a signal to be transmitted in the transmit band and the power amplifier of the phone. The modulator output is connected to an input of the phase sensitive detector of the phase locked loop and the input of the power amplifier is connected to the voltage controlled oscillator of the loop. The wide band noise of the transmitter signal supplied to the power amplifier is then determined by the phase noise of the voltage controlled oscillator when the loop is locked. However, low phase noise voltage controlled oscillators for operation at UHF are relatively expensive.

SUMMARY OF THE INVENTION

The object of the present invention is to provide a mobile phone apparatus which is capable of meeting the stringent specifications on transmitter noise in the receive band.

The object of the present invention is achieved by a mobile phone apparatus comprising a modulator for producing a signal to be transmitted in a transmit band, a power amplifier for supplying the signal to be transmitted to an aerial, a tunable filter disposed between the modulator and the power amplifier and having a passband and an attenuation band, and a control circuit for tuning the filter such that the passband is at the transmit band and the attenuation band is at a receive band of the apparatus.

According to the present invention, none of the power amplifier output is lost so that talk time is not substantially affected. A relatively simple and inexpensive circuit may be used so that the cost of the apparatus is not substantially affected.

The above and other objects, features and advantages of the present invention will become apparent from the following description referring to the accompanying drawings which illustrate an example of a preferred embodiment of the present invention.

DESCRIPTION OF THE PREFERRED EMBODIMENT

Figure 1:
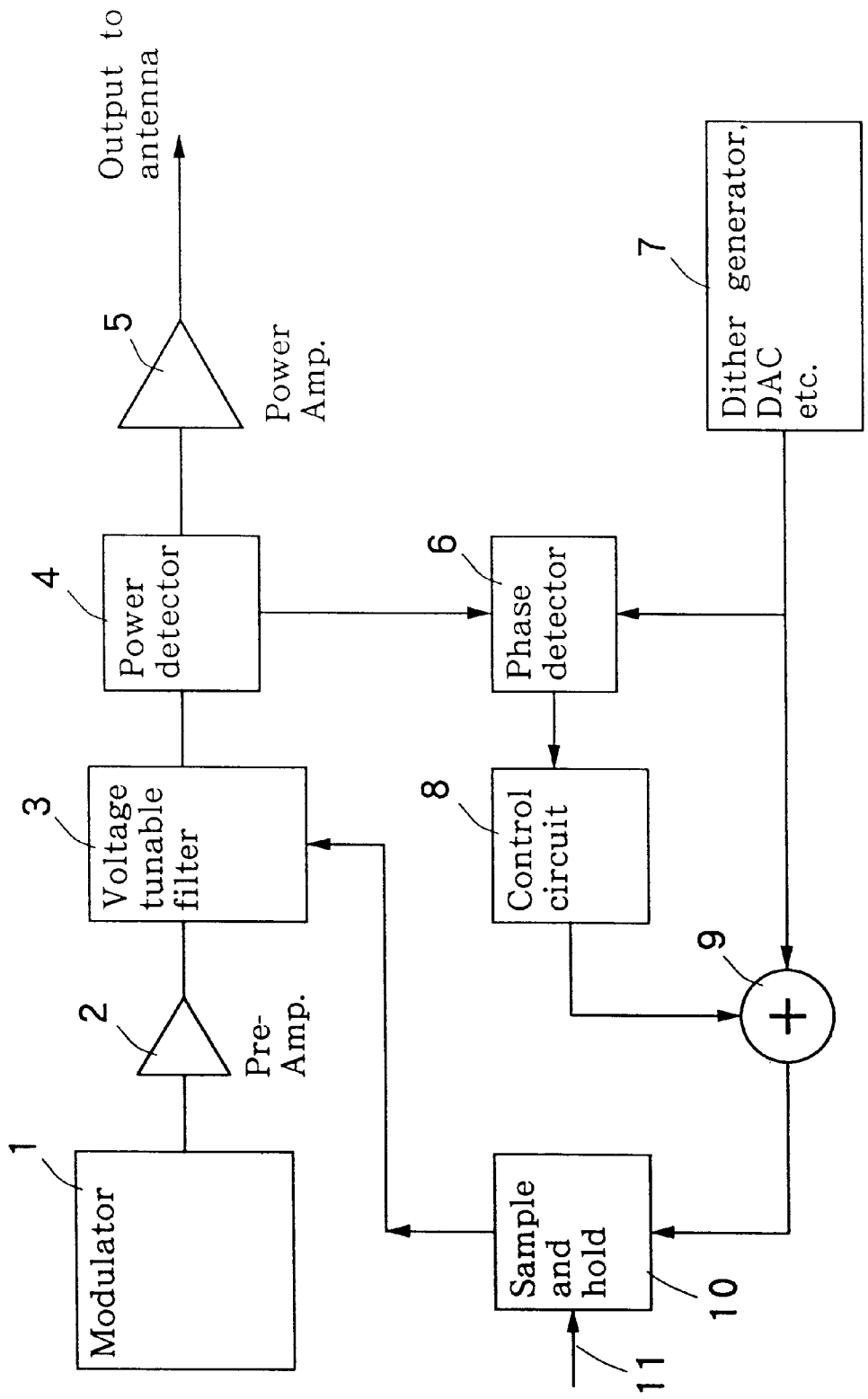
FIG. 1 is a block circuit diagram of a mobile phone apparatus constituting an embodiment of the invention.

The apparatus comprises a modulator which produces a modulated carrier in the UHF band in accordance with a standard system such as a TDMA (GSM) system. The output of the modulator 1 is supplied via a preamplifier 2 to a voltage tunable filter 3. The output of the filter 3 is connected to a power detector 4 and to the input of a power amplifier 5 whose output supplies a transmit signal to an antenna.

The output of the power detector 4 is connected to a first input of a phase detector 6, which may comprise a multiplier and whose other input is connected to the output of a dither generator 7. The output of the phase detector 6 is connected to the input of a control circuit 8, for instance in the form of an operational amplifier, one of whose inputs constitutes the input of the control circuit 8 and the other of whose inputs is connected to a reference voltage source for supplying a reference voltage corresponding to maximum output power of the filter 3. The outputs of the generator 7 and the control circuit 8 are connected to inputs of a summer 9 whose output is connected via a sample and hold circuit 10 to the tuning voltage input of the filter 3.

Figure 2:
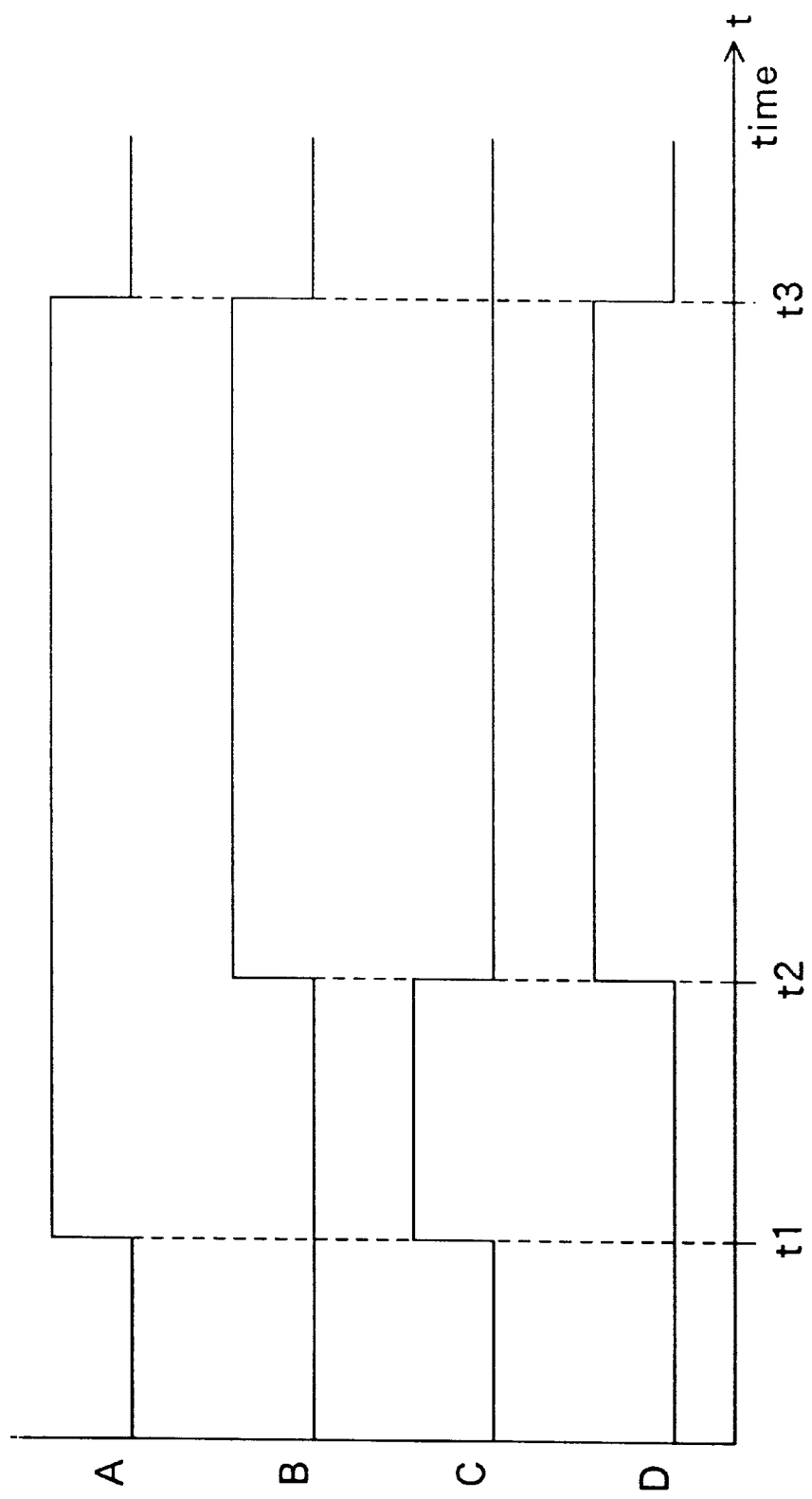
FIG. 2 is a timing diagram showing waveforms occurring in the apparatus of FIG. 1.

In FIG. 2, A shows the envelope of the output signal of the preamplifier 2, B shows the envelope of the output signal of the power amplifier 5 during the transmit slot between times t2 and t3, and C shows the filter calibration period between times t1 and t2.

During normal operation of the apparatus, when a signal is to be transmitted, the power amplifier 5 is initially disabled so that the circuits within the modulator 1 and elsewhere can settle without being affected by power supply transients caused by switching on of the preamplifier 2. During this initial phase of a transmit sequence, starting at time t1 in FIG. 2, a signal D is supplied to a control input 11 of the sample and hold circuit 10 which disables the hold function and causes the output of the summer 9 to be supplied directly to the tuning voltage input of the filter 3.

The dither generator 7, which may for instance be embodied as a digital-to-analog converter (DAC) connected to the outputs of a suitably controlled counter or microprocessor, produces a varying voltage whose amplitude is such as to tune the filter 3 to a frequency in the region of the required tuning frequency i.e. in the frequency band containing the transmit signal from the preamplifier 2. The output voltage of the generator 7 is "dithered" between two adjacent values so that the voltage tunable filter 3 is tuned between two adjacent rejection values. The filter 3 is preferably a bandpass filter having a passband sufficiently wide to pass the transmit signal from the preamplifier 2 and, outside the passband, a degree of attenuation such that noise in the receive band of the apparatus originating from the output of the power amplifier 5 meets the necessary specification. Other types of filter, such as a high pass filter, could alternatively be used.

As the passband of the filter 3 dithers between two centre frequencies, the amount of power supplied by the filter 3 from the modulator 1 and preamplifier 2 to the power detector 4 varies. The output of the detector 4 is thus a varying voltage whose phase of variation with respect to the output signal of the generator 7 depends on whether the transmit signal is above or below the passbands of the filter 3. For instance, if the frequency of the transmit signal is below a first passband and a second passband which is higher than the first passband, as the filter switches from the first passband to the second passband, the output of the detector 4 will fall. However, if the transmit signal is above the first and second passbands, switching from the first passband to the second passband causes the output signal of the detector 4 to rise. The output of the phase detector 6 thus provides a signal whose polarity and magnitude depend on the polarity and magnitude of the difference between the transmit band and the filter passbands.

The control circuit 8 compares the output of the detector 6 with a reference value corresponding to the maximum output of the filter 3 when correctly tuned. The circuit 8 therefore generates an error signal which is added to the signal from the generator 7 so as to tune the filter 3 towards the transmit band. This arrangement acts as a servo feedback arrangement for locking the passband of the filter 3 to the transmit band of the transmit signal from the modulator 1.

When the control circuit 8 detects that the output power of the filter 3 is at the predetermined value, the sample and hold circuit 10 is enabled at time t2 to sample and hold the correct value of the tuning voltage which is then supplied to the filter 3. The filter passband is therefore locked on to the transmit band. The power amplifier 5 is then enabled to allow transmission to begin at its predetermined time, for instance at time t2 as shown in FIG. 2.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A mobile phone apparatus comprising:

a modulator for producing a signal to be transmitted in a transmit band;

a power amplifier for supplying the signal to be transmitted to an aerial;

a tunable filter disposed between the modulator and the power amplifier and having a passband and an attenuation band; and a control circuit for tuning the filter such that the passband is at the transmit band and the attenuation band is at a receive band of the apparatus;

wherein the filter is voltage tunable, wherein the control circuit comprises a power detector connected to the output of the filter and a control loop for varying the tuning voltage of the filter until a predetermined power is detected, wherein the control loop comprises a signal generator for generating a varying voltage for the filter and a feedback circuit whose input is connected to the power detector and whose output is superimposed on the varying voltage, and wherein the feedback circuit comprises a multiplier whose inputs are connected to the power detector and the signal generator and a comparator for comparing the output of the multiplier with a reference level corresponding to the predetermined power.

2. The apparatus according to claim 1, further comprising a hold circuit for holding the tuning voltage following tuning of the filter.

3. A mobile phone apparatus comprising:

a modulator for producing a signal to be transmitted in a transmit band;

a power amplifier for supplying the signal to be transmitted to an aerial;

a tunable filter disposed between the modulator and the power amplifier and having a passband and an attenuation band; and a control circuit for tuning the filter such that the passband is at the transmit band and the attenuation band is at a receive band of the apparatus;

wherein the filter is a bandpass filter, wherein the filter is voltage tunable, wherein the control circuit comprises a power detector connected to the output of the filter and a control loop for varying the tuning voltage of the filter until a predetermined power is detected, wherein the control loop comprises a signal generator for generating a varying voltage for the filter and a feedback circuit whose input is connected to the power detector and whose output is superimposed on the varying voltage, and wherein the feedback circuit comprises a multiplier whose inputs are connected to the power detector and the signal generator and a comparator for comparing the output of the multiplier with a reference level corresponding to the predetermined power.

\* \* \* \* \*